United States Patent [19]

Tsay et al.

[11] Patent Number: 5,120,993
[45] Date of Patent: Jun. 9, 1992

[54] SUBSTRATE BIAS VOLTAGE DETECTION CIRCUIT

[75] Inventors: Ching-Yuh Tsay, Richardson; Narasimhan Iyengar, Plano, both of Tex.

[73] Assignee: Texas Instruments Incorporated, Dallas, Tex.

[21] Appl. No.: 733,062

[22] Filed: Jul. 17, 1991

Related U.S. Application Data

[63] Continuation of Ser. No. 475,061, Feb. 5, 1990, abandoned.

[51] Int. Cl.⁵ .................................................. G05F 1/46
[52] U.S. Cl. ............................ 307/296.4; 307/296.2; 307/296.5; 365/228
[58] Field of Search ............... 307/296.2, 296.4, 296.5, 307/362; 365/226, 228

[56] References Cited

U.S. PATENT DOCUMENTS

4,739,191 4/1988 Puar ................................. 307/296.2

FOREIGN PATENT DOCUMENTS

0065467 4/1984 Japan ................................ 307/296.2

OTHER PUBLICATIONS

Hummel, "Sentry Circuit for Substrate Voltage Control", IBM T.D.B., vol. 15, No. 2 (Jul. 1972).

"Voltage Regulator Circuit for CMOS Substrate Voltage Generator", IBM T.D.B., vol. 28, No. 3, Aug. 1985. Harrom, "Substrate Bias Voltage Control", IBM T.D.B., vol. 22, No. 7, Dec. 1976.

Primary Examiner—David Hudspeth
Attorney, Agent, or Firm—Robby T. Holland; Rene' E. Grossman; Richard L. Doanldson

[57] ABSTRACT

A substrate bias detection circuit is disclosed. The circuit includes first and second transistors, where the first transistor has its source coupled to the substrate and where the second transistor has its source coupled to a common potential (i.e., ground). The gate and drain of the first transistor are connected together, and to the gate of the second transistor. Load devices are connected between the drains of the first and second transistors and a bias potential from a power supply node. The threshold voltages of the first and second transistors may be different, with the difference determining the voltage that the substrate must reach, relative to the common potential, to cause the circuit to respond. Upon the substrate reaching a voltage sufficient to turn the second transistor on, the drain of the second transistor will be pulled toward the common potential, indicating loss of substrate bias. The circuit may be included into an integrated circuit in such a manner that power supply voltages may be disconnected from other circuitry in the event of loss of substrate bias, precluding the possibility of latchup in such other circuitry.

21 Claims, 4 Drawing Sheets

SUBSTRATE BIAS VOLTAGE DETECTION CIRCUIT

This application is a continuation of application Ser. No. 07/475,061, filed Feb. 5, 1990, now abandoned.

This invention is in the field of integrated circuits, and more specifically is directed to circuits for detecting the level of a bias voltage.

BACKGROUND OF THE INVENTION

Many modern integrated circuits are fabricated according to complementary-metal-oxide-semiconductor (CMOS) technology, where both p-channel and n-channel MOS transistors are formed in the same semiconductor chip. CMOS technology provides good performance together with much reduced power consumption, as compared with other technologies such as bipolar and n-channel MOS. As is well known, however, CMOS structures have present a parasitic thyristor, or SCR, formed by alternating p-type and n-type structures. If the CMOS integrated circuit is exposed to a voltage which is above the firing voltage of the parasitic SCR, a latchup condition can occur. Once the structure is in latchup, destructive amounts of current can be drawn through the SCR, often damaging the integrated circuit.

Many techniques for reducing the tendency of latchup for a given integrated circuit have been utilized. One such technique is the provision of a substrate bias which is more negative than the ground, or common, potential provided to the integrated circuit. Of course, such negative substrate bias is also useful for other reasons, such as improving the performance of the integrated circuit by raising the threshold voltage of enhancement-mode n-channel MOS transistors. However, the presence of the negative substrate bias can ensure that the base-emitter junction of one of the parasitic bipolar transistors in the parasitic SCR does not become forward-biased for reasonable excursions of voltages applied to the integrated circuit. Without the forward-biased condition at the base-emitter junction of the parasitic bipolar transistor, latchup by way of the parasitic SCR cannot occur.

Such negative substrate bias can be provided by way of a voltage applied to the integrated circuit chip from an external power supply; the necessity for such an external power supply is not favored by many integrated circuit users, due to the increase in the system cost required to provide such a power supply. Accordingly, a preferred way of providing substrate bias at a voltage more negative than the chip ground potential is by way of a charge pump. Examples of charge pump circuits for providing substrate bias are described in U.S. Pat. No. 4,585,954, issued Apr. 29, 1986, U.S. Pat. No. 4,628,215, issued Dec. 9, 1986, and in U.S. Pat. No. 4,631,421, issued Dec. 23, 1986, all assigned to Texas Instruments Incorporated and incorporated herein by this reference. Whether the substrate bias is applied from external to the chip or generated on-chip, if the substrate bias is lost for some reason, the integrated circuit can become vulnerable to the latchup condition.

It is therefore an object of this invention to provide a circuit which can detect the loss of proper substrate bias.

It is a further object of this invention to provide such a circuit on-chip with a VLSI integrated circuit.

It is a further object of this invention to provide such a circuit where the level at which substrate bias is detected does not strongly depend upon transistor sizes or channel width/length ratios.

It is a further object of this invention to provide an integrated circuit which has on-chip circuitry to disable power supply voltages from portions of the chip responsive to loss of proper substrate bias.

Other objects and advantages of the invention will be apparent to those of ordinary skill in the art having reference to the following specification together with the drawings.

SUMMARY OF THE INVENTION

The invention may be incorporated into a substrate bias detection circuit which compares the substrate bias voltage to a reference potential, such as ground. A first transistor has its source connected to the substrate, and has its gate and drain connected together to a load device which is biased by a power supply voltage. The drain of the first transistor is connected to an inverter, where the pull-down transistor has its source connected to the reference potential against which the substrate bias is to be compared. If the substrate bias reaches a level sufficiently near the reference potential, the pull-down transistor will become conductive, generating a signal. The threshold voltages of the first transistor and the pull-down transistor may be different from one another to adjust the voltage at which the circuit generates the signal.

The output from the detection circuit can be used to disable other on-chip circuitry, including on-chip voltage regulator/drivers. In this way, the risk of latchup for much of the integrated circuit in the event of a loss of substrate bias can be reduced.

DETAILED DESCRIPTION OF THE PREFERRED EMBODIMENT

Figure 1:
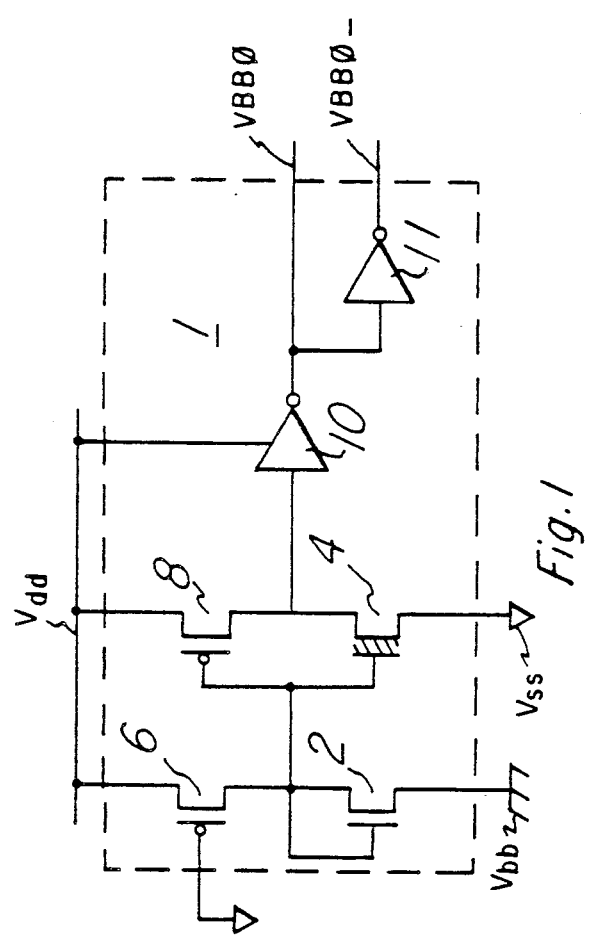
FIG. 1 is an electrical diagram, in schematic form, of a substrate bias detection circuit according to the preferred embodiment of the invention.

Referring to FIG. 1, the construction of a bias voltage detection circuit 1 according to the preferred embodiment of the invention will be described in detail. Detection circuit 1 receives as inputs the voltage to be detected and bias voltages. In this example, the voltage to be detected is the substrate bias voltage $V_{bb}$, which is received at the source of transistor 2. The bias voltages include, in this example, the positive power supply voltage $V_{dd}$, and a common, or ground, potential $V_{ss}$. In this example, the desired potential of the substrate bias $V_{bb}$ is below $V_{ss}$ (for example, at a level on the order of −2.0 volts). As is well known in the art for conventional CMOS structures, such negative substrate bias is useful in reducing the susceptibility of the parasitic SCR in the CMOS structure from entering a latchup condition. Detection circuit 1 has an output, on line VBB0, which is at a high logic level when the substrate bias $V_{bb}$ is at a potential above $V_{ss}$, and is at a low logic level when the substrate bias $V_{bb}$ is below $V_{ss}$. As will be described hereinbelow, the signal generated by detection circuit 1 on line VBB0 can be used to shut down other circuits on the same integrated circuit chip to avoid such other circuits from entering a latchup state in the absence of sufficient substrate bias.

In detection circuit 1, n-channel transistor 2 has its source connected to the substrate node $V_{bb}$. The gate of transistor 2 is connected to its drain, and both are connected to the drain of a p-channel transistor 6. P-channel transistor 6 has its source connected to $V_{dd}$, and its gate biased to $V_{ss}$, and thus presents a pull-up load to transistor 2. The drains of transistors 2 and 6 are connected to the gates of n-channel transistor 4 and p-channel transistor 8. N-channel transistor 4 and p-channel transistor 8 are connected in inverter fashion, with the source of n-channel transistor 4 biased to $V_{ss}$. The source of p-channel load transistor 8 is biased to $V_{dd}$, and the drains of transistors 4 and 8 are connected together. Inverter 10 has its input connected to the drains of transistors 4 and 8, and its output drives line VBB0, presenting the output of detection circuit 1 with the desired logic scheme (i.e., line VBB0 indicating the absence of sufficient substrate bias with a high logic level). Inverter 11 has its input connected to the output of inverter 10, and presents a signal on line VBB0_ which is the logical complement of the signal on line VBB0, and thus indicates loss of $V_{bb}$ with a low logic level.

It is desirable that the potential of $V_{bb}$ at which detection circuit 1 issues a loss-of-$V_{bb}$ signal on line VBB0 be at some level below $V_{ss}$. This ensures that the remainder of the integrated circuit is disabled well prior to such time as the substrate reaches the voltage at which the base-emitter junction of one of the transistors in the parasitic SCR is forward biased. The detection voltage is preferably close to $V_{ss}$, so that detection circuit 1 will thus only respond to those conditions for which latchup can occur, and will tend not to respond to noise and other transient conditions which can often occur in large scale integrated circuits. The level at which detection circuit 1 trips is set in this embodiment by the difference in threshold voltages between transistors 2 and 4. In this embodiment, transistor 2, to which $V_{bb}$ is connected, has a higher threshold voltage than transistor 4, to which $V_{ss}$ is connected. For example, the threshold voltage $V_{t2}$ of transistor 2 can be on the order of +0.8 volts (measured at $V_{bb}$ of −2.0 volts) and the threshold voltage $V_{t4}$ of transistor 4 can be on the order of +0.5 volts (measured at $V_{bb}$ of −2.0 volts), establishing a difference therebetween on the order of 0.3 volts.

In operation, p-channel load transistor 6 is in the on-state, due to its gate biased to $V_{ss}$, which biases the gate and drain of transistor 2 into the on-state also. It is preferable that transistor 2 have a much larger width-to-length (W/L) ratio than transistor 6, so that with both transistors in the on-state, the DC current drawn through transistors 2 and 6 is minimal. For example, the W/L ratio of n-channel transistor 2 may be on the order of 100, and the W/L ratio of p-channel transistor 6 may be on the order of 0.005. The voltage at the drains of transistor 2 and 6 will thus be pulled low through transistor 2, until it reaches a level at which transistor 2 turns off. This is approximately at a threshold voltage $V_{t2}$ above $V_{bb}$. Accordingly, the voltage at the gates of transistors 4 and 8 is approximately at $V_{bb}+V_{t2}$.

The voltage $V_{bb}+V_{t2}$ is sufficiently low, in this embodiment, to turn on p-channel transistor 8. Transistor 8 preferably has a small W/L ratio, compared to transistor 4; for example, transistor 8 may have a W/L ratio on the order of 0.05, with the W/L ratio of transistor 4 on the order of 20. Transistor 4 will, of course, turn on when its gate voltage is at a level greater than its threshold voltage $V_{t4}$ above $V_{ss}$. Since the voltage at the gate of transistor 4 is at $V_{bb}+V_{t2}$, transistor 4 turns on when the following inequality is satisfied:

$$(V_{bb}+V_{t2})-V_{ss}>V_{t4}$$

which is equivalent to:

$$V_{bb}-V_{ss}>V_{t4}-V_{t2}$$

Figure 2:
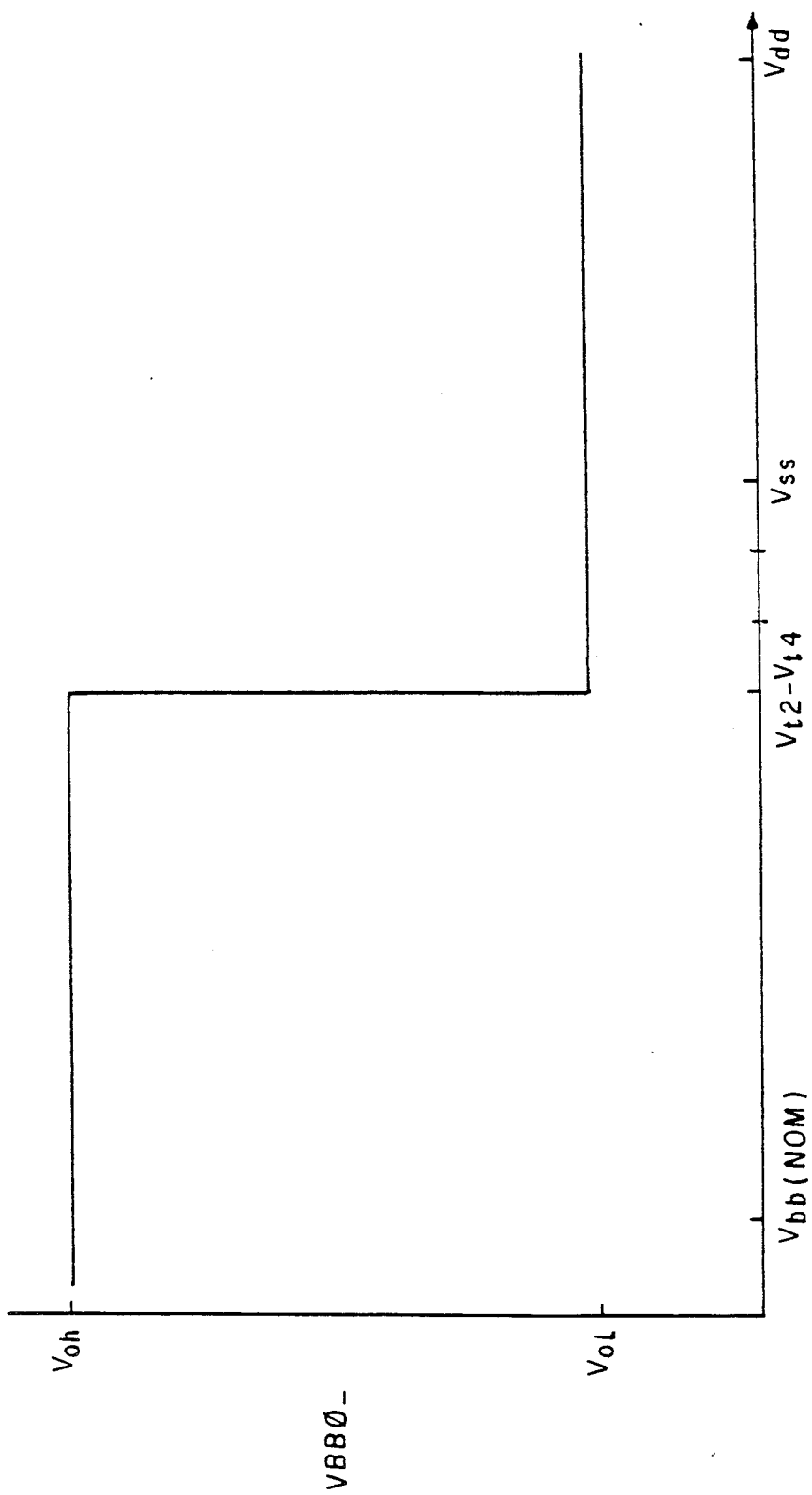
FIG. 2 is a transfer characteristic of the circuit of FIG. 1.

FIG. 2 shows the DC transfer characteristic of substrate bias detection circuit 1 shown in FIG. 1. As is shown in FIG. 2, at the nominal $V_{bb}$ bias $V_{bb}$(NOM), which is well below $V_{ss}$ (e.g., at −2.0 volts), line VBB0_ is at a high logic level, indicating adequate substrate bias. The trip point of the circuit is at the value $V_{t4}-V_{t2}$, as described above. Below this voltage for $V_{bb}$, line VBB0_ is at a high logic level; above this voltage, circuit 1 operates to present a low logic level on line VBB0_ at the output of inverter 11. Of course, the logic state on line VBB0 at the output of inverter 10 is complementary to the logic state on line VBB0_ shown in FIG. 1.

In the example of detection circuit 1 described hereinabove, where $V_{t2}$ is greater than $V_{t4}$ by 300 mV, transistor 4 will turn on when $V_{bb}$ is approximately at a value of −0.3 volts ($V_{ss}=0.0$ volts). Since transistor 4 is significantly larger than transistor 8, the drains of transistors 4 and 8, and thus the input to inverter 10, will be pulled low to $V_{ss}$ by transistor 4. A high logic level will, in turn, be presented by inverter 10 on line VBB0 at its output, and a low logic level will be presented by inverter 11 on line VBB0_ at its output.

Figure 3:
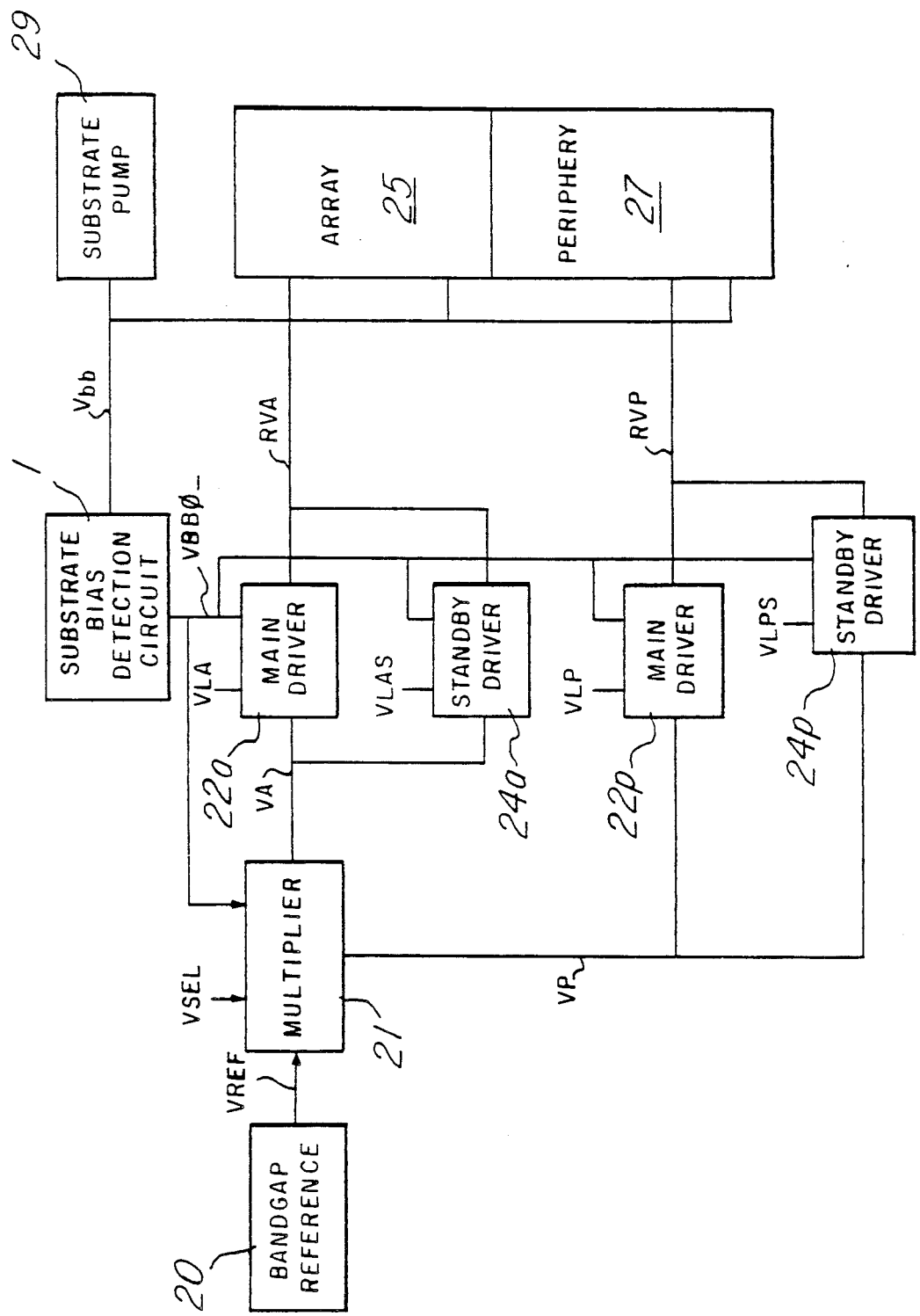
FIG. 3 is an electrical diagram, in block form, of an on-chip regulated driver system for an integrated circuit which is responsive to the circuit of FIG. 1.

Referring now to FIG. 3, an internal regulated power supply system which may be included on-chip with the functional integrated circuit, and which operates responsive to detection circuit 1, will be described. FIG. 3 illustrates, in block form, an example of an on-chip power supply system for a memory device such as a dynamic random access memory (dRAM). In such devices, it may be preferable to bias portions of the device, such as the memory storage array and the sense amplifiers (shown in FIG. 3 as block 25) with a lower voltage than is used to bias the remainder of the device such as the input, clock and output buffers, and the remainder of the periphery 27. For each group of circuitry (array 25 and periphery 27) in the example of FIG. 3, the externally applied power supply $V_{dd}$ is used solely for biasing the regulated voltage drivers, and does not directly bias either array 25 or periphery 27.

In FIG. 3, the system includes a conventional bandgap voltage reference generator circuit 20 for generating a stable reference voltage. Many such bandgap voltage reference generator circuits are well known in the art, and accordingly bandgap circuit 20 will not be further described herein. The output of bandgap reference circuit 20 is a reference voltage $V_{REF}$, which is presented to voltage multiplier circuit 21. Voltage multiplier circuit 21 may be constructed according to one of many conventional configurations, and generates, in this example, two output voltages from the voltage $V_{REF}$, one being $V_A$ and the other $V_P$. For example, the voltage on line $V_A$ may be on the order of 3.3 volts, while the voltage on line $V_P$ may be on the order of 4.0 volts.

The voltage on lines $V_A$ and $V_P$ are each connected to two drivers. Output drivers $22_A$ and $22_P$ power array 25 and periphery 27, respectively, during active operation, while standby drivers $24_A$ and $24_P$ bias array 25 and periphery 27, respectively, when the circuit is in a standby condition. Array 25 and periphery 27 also have substrate bias $V_{bb}$ applied thereto from substrate pump 29. Substrate pump 29 may be constructed according to one of many conventional configurations for generating a bias voltage below $V_{ss}$. Examples of conventional substrate pumps are described in U.S. Pat. No. 4,585,954, issued Apr. 29, 1986, U.S. Pat. No. 4,628,215, issued Dec. 9, 1986, and in U.S. Pat. No. 4,631,421, issued Dec. 23, 1986, all assigned to Texas Instruments Incorporated and incorporated herein by this reference. In the alternative, $V_{bb}$ may be provided to an external terminal of the integrated circuit. The $V_{bb}$ voltage is connected to substrate bias detection circuit 1 as well, so that its voltage can be detected and compared against $V_{ss}$ in the manner described hereinabove.

Besides receiving the voltage on its associated one of lines $V_A$ and $V_P$, each of drivers 22 and 24 also receive a signal on line VBB0_ from detection circuit 1. In this example, as described above, line VBB0_ will have a low logic level in the event that the substrate bias $V_{bb}$ is insufficient, as measured against $V_{ss}$. Each of drivers 22 and 24 are biased by $V_{dd}$ (not shown), which is externally presented to the chip, as well as by the voltages $V_A$ and $V_P$ generated by multiplier circuit 22. Lines $V_{LA}$, $V_{LAS}$, $V_{LP}$, and $V_{LPS}$ are received by drivers $22_A$, $24_A$, $22_P$ and $24_P$, respectively, and serve as enable signals thereto. main drivers $22_A$ and $22_P$ are enabled and disabled by signals on lines $V_{LA}$ and $V_{LP}$, respectively, so that they bias their respective portions of the circuit only during active operations, and are disabled during such time as the device is in a standby state. In the example of a conventional dRAM device, enabling signals on lines $V_{LA}$ and $V_{LP}$ can be generated from the row address strobe (RAS_) signal, so that main drivers 22 are active only during the active portions of memory cycles.

Standby drivers $24_A$ and $24_P$ are preferably similarly constructed as main drivers $22_A$ and $22_P$, only with smaller transistors so that the current drawn therethrough, and the power dissipated thereby, is reduced during such standby times. It should be noted that lines $V_{LAS}$ and $V_{LPS}$ can allow the enabling and disabling of standby drivers $24_A$ and $24_P$, respectively, so that they can be disabled during such time as main drivers $22_A$ and $22_P$ are active. However, due to the low current draw of standby drivers 24, it is preferable to keep standby drivers 24 enabled during all cycles (both active and standby), so that the control logic is minimized.

Figure 4:
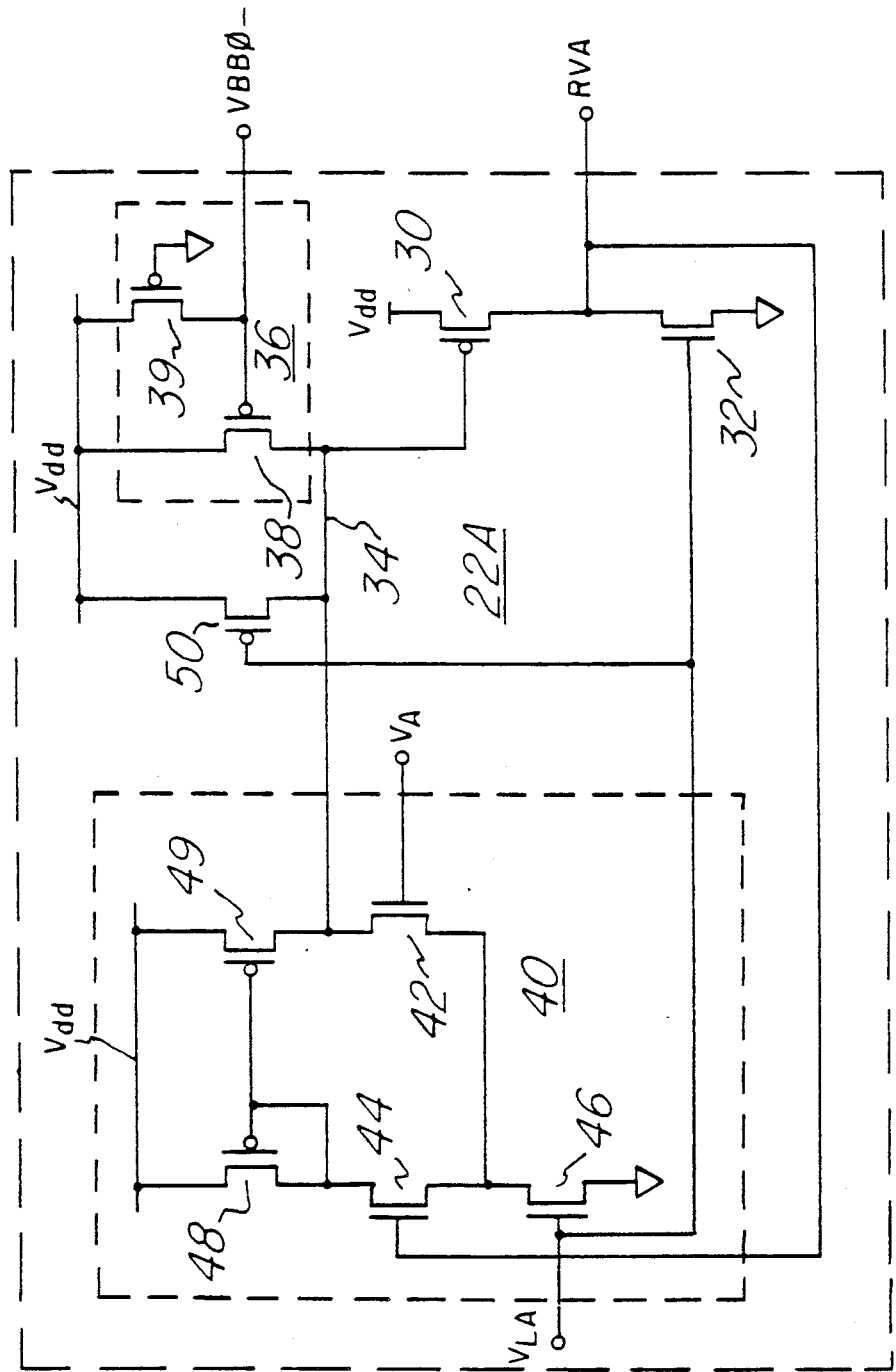
FIG. 4 is an electrical diagram, in schematic form, of a regulated voltage driver circuit utilized in the system of FIG. 2.

Referring now to FIG. 4, the construction of driver 22A will be described in detail. It should be noted that each of drivers 22 and 24, whether associated with array 25 or periphery 27, can be constructed according to the circuit of FIG. 4, or of course according to other conventional designs for voltage driver circuits. The circuit of FIG. 4 is particularly adapted for having its output disabled in the event of loss of substrate bias, communicated thereto by way of line VBB0_ from substrate bias detection circuit 1.

As shown in FIG. 4, driver $22_A$ receives the externally provided $V_{dd}$ supply, a voltage on line $V_A$, and signals on lines $V_{LA}$ and VBB0_. Line RVA is the output of driver 22A, and is driven by the drains of p-channel transistor 30 and n-channel transistor 32 connected in push-pull fashion. The source of p-channel transistor 30 is biased by $V_{dd}$, and its gate is connected to node 34; the source of n-channel transistor 32 is at ground, and its gate is controlled by line $V_{LA}$. The function of n-channel transistor 32 is to pull node RVA low during such time as transistor 30 is turned off. Since the discharging of line RVA through transistor 32 can occur quite slowly, the size of transistor 32 can be quite small relative to transistor 30. It should be noted that n-channel transistor 32 is preferably much smaller than p-channel transistor 30, so that with both transistors in the on-state, the power dissipation therethrough will be minimized. For example, the W/L ratio of transistor 32 can be on the order of 0.01, while the W/L ratio of transistor 30 can be on the order of 50 to 100.

Comparator 40 drives node 34 with a voltage depending upon the level of line $V_A$ relative to the level of line RVA driven by main driver $22_A$. Comparator 40 is configured according to conventional techniques, with the n-channel MOS differential amplifier of transistors 42 and 44 having a current mirror active load of transistors 48 and 49. Line $V_A$ is connected to comparator 40 via its connection to the gate of n-channel transistor 42, to provide a reference voltage to comparator 40. N-channel transistor 44 has its gate connected to line RVA, to provide feedback to comparator 40. Line $V_{LA}$ is connected to the gate of n-channel transistor 46, which has its drain connected to the sources of transistors 42 and 44, and has its source connected to ground. P-channel transistor 48 has its source biased at $V_{dd}$, and has its drain connected to the drain of or 44. Similarly, p-channel transistor 49 has its source biased at $V_{dd}$ and has its drain connected to the drain of transistor 42. The gates of transistors 48 and 49 are connected to the drains of transistors 48 and 44. The drains of transistors 49 and 42 are connected to node 34, which controls the gate of p-channel pull-up transistor 30.

In comparator 40, the sizes (i.e., W/L ratios) of certain transistor pairs are preferably well matched so that the voltages $V_A$ and $V_P$ presented by voltage multiplier 22 are indeed the voltages applied to the array, sense amplifiers, and periphery by the drivers 22 and 24. In comparator 40 of FIG. 4, the W/L ratios of transistors 42 and 44 are preferably matched to one another (for example, with W/L on the order of 10), and the ratios of transistors 48 and 49 are preferably well matched (for example, with W/L on the order of 15 to 20).

P-channel transistor 50 has its source biased by $V_{dd}$, and has its drain connected to node 34, which also controls the gate of p-channel pull-up transistor 30. The gate of transistor 50 is connected to line $V_{LA}$. As will be described in further detail hereinbelow, p-channel transistor 30 and n-channel transistor 32 are both turned off when line $V_{LA}$ is at a low logic level. Accordingly, a low logic level on line $V_{LA}$ will place line RVA in a high impedance state, allowing standby driver $24_A$, in this case, to bias array 25 (and sense amplifiers) of the memory device without being loaded by main driver $22_A$. As noted above, drivers $22_P$ and $24_P$ can be similarly configured for biasing periphery 27 of the memory device.

Also included in main driver $22_A$, according to this embodiment of the invention, is disable circuit 36, which also controls node 34. Disable circuit 36 includes a p-channel transistor 38, with its source biased by $V_{dd}$ and its drain connected to node 34. Line VBB0_ is connected to the gate of p-channel transistor 38. P-channel transistor 39 has its source-to-drain path connected between $V_{dd}$ and the gate of transistor 38, and has its gate biased to ground. This actively pulls up the gate of transistor 38, holding transistor 38 in the off state in the event that line VBB0_ for some reason floats. Transistor 39 is quite small (W/L on the order of 0.5, for example), so that a low logic state driven by substrate bias detection circuit 1 can easily overcome the drive of transistor 39.

In operation, comparator 40 is enabled by line $V_{LA}$ being at a high logic level. With line $V_{LA}$ high, transistor 46 is turned on, and acts as a current source to ground. The sources of transistors 42 and 44 are pulled by transistor 46 to a voltage which is an n-channel threshold voltage ($V_{tn}$) below the voltage at lines $V_A$ and RVA, respectively. This allows transistors 42 and 44 to be conductive responsive to voltages applied to their respective gates, enabling the operation of comparator 40 to apply a voltage to node 34 which is based on the voltage on line $V_A$ from multiplier 21. In addition, with line $V_{LA}$ at a high logic level, transistor 50 is turned off, and transistor 32 is turned on.

Also in normal operation, with sufficiently negative $V_{bb}$ bias at the substrate of the device, line VBB0_ is driven to a high logic level by substrate bias detection circuit 1. This ensures that transistor 38 is turned off, which disconnects disable circuit 36 from node 34. It should be noted that transistor 39 is always in an on-state with a positive $V_{dd}$, which ensures that the gate of transistor 38 remains at a high voltage even in the absence of a driven signal from substrate bias detection circuit 1 on line VBB0_.

As noted above, with main driver $22_A$ selected by line $V_{LA}$ at a high logic level, transistor 46 acts as a current source in comparator 40. Beginning with line RVA at a voltage below line $V_A$, transistor 42 will be more conductive than will transistor 44, due to the voltage on line $V_A$ being higher than the voltage on line RVA. Accordingly, the bulk of the current through current source transistor 46 will be drawn by transistors 49 and 42, rather than by transistors 48 and 44. In order to satisfy the transistor current-voltage relationships, the high current passing through transistor 49 relative to transistor 48 will cause the voltage at the drain of transistor 48 to rise toward $V_{dd}$, and will cause the voltage at the drain of transistor 49 to fall toward ground. With the drains of transistors 42 and 49 at node 34 falling, transistor 30 will become more conductive, pulling line RVA toward $V_{dd}$.

As line RVA is pulled toward $V_{dd}$, transistor 44 will tend to conduct more current. This will in turn draw more current through transistor 48 and less current through transistor 49, which in turn will cause the voltage at the drains of transistors 49 and 42 at node 34 to rise as the current therethrough is reduced. As node 34 rises, transistor 30 becomes less conductive, and the voltage at line RVA will fall via transistor 32.

As discussed above, it is preferable that transistors 42 and 44 be closely matched to one another, and that transistors 48 and 49 also be closely matched to one another. With adequate matching of these transistor pairs, the operation of comparator 40 will tend toward a point where the current passing through transistors 42 and 49 will match the current passing through transistors 44 and 48, with the gate-to-source voltages of transistors 48 and 49 becoming equal. Accordingly, comparator 40 will, in the steady-state, reach the operating condition where the voltage at line RVA equals the voltage at line $V_A$. Main driver $22_A$, when enabled by line $V_{LA}$, thus will drive array 25 according to the voltage on line $V_A$, which in this case is on the order of 3.3 volts.

In the event that main driver $22_A$ is to be disabled, such as during a standby operation, line $V_{LA}$ will be at a low logic level. This will turn off transistor 46, disabling the operation of comparator 40. In addition, transistor 50 will be turned on by the low level on line $V_{LA}$, so that $V_{dd}$ is coupled to the gate of transistor 30, turning it off. Transistor 32 is also turned off by line $V_{LA}$ at a low logic level. With both transistors 30 and 32 turned off, main driver $22_A$ thus presents a high impedance to line RVA, allowing standby driver $24_A$ to drive line RVA and to bias array 25, without main driver $22_A$ loading line RVA.

With main driver 22A of FIG. 4 enabled by line $V_{LA}$ at a high logic level, disable circuit 36 is operable to shut down the bias on line RVA. In the event that the voltage $V_{bb}$ at the substrate of the integrated circuit rises sufficiently toward the voltage of $V_{ss}$ that substrate bias detection circuit 1 switches, as described hereinabove, a low logic level will be presented thereby on line VBB0_. This will turn on transistor 38, causing the voltage $V_{dd}$ to be placed at node 34. This will turn off transistor 30, so that line RVA which is communicated to the remainder of the circuit (in this case array 25 of a memory device) cannot be driven to $V_{dd}$ by transistor 30. Transistor 32 will remain in the on-state, due to line $V_{LA}$ enabling main driver $22_A$. Since standby driver $24_A$ similarly receives the loss of $V_{bb}$ signal on line VBB0_, and is similarly constructed as main driver $22_A$ as described above, line RVA will be pulled fully toward $V_{ss}$ by transistor 32. In this example, bias to periphery 27 of the memory device is also removed by the similar operation of drivers $22_P$ and $24_P$ in the event of loss of substrate bias.

Alternatively, it may be preferable to place the output of main driver $22_A$ in a high impedance condition when substrate bias is lost, rather than to pull it low via transistor 32 as described above. This may be accomplished by using the output of substrate bias detection circuit 1 to also gate the signal on line $V_{LA}$, so that line $V_{LA}$ is driven to a low logic level responsive to substrate bias detection circuit 1 detecting loss of adequate substrate bias. Such gating of line $V_{LA}$, as well as the use of the output of substrate bias detection circuit 1 to enable or disable other signals in the integrated circuit, will be apparent to one of ordinary skill in the art from this description.

Accordingly, the remainder of the circuit can be disabled in the event that a low logic level signal is received on line VBB0_. Without positive bias to those portions of the circuit biased by drivers 22 and 24, those portions of the circuit cannot enter the latch-up condition even with zero substrate bias. In this way, the loss of substrate bias is communicated by substrate bias detection circuit 1 to the remainder of the circuit, disabling the circuit so that a latchup condition cannot occur with the substrate bias lost.

It should be noted that the benefits of the invention relating to the disabling of portions of the circuit can be achieved in circuits not having the full regulated biasing scheme shown in FIG. 2. For example, the integrated circuit using the invention may have its positive power supply bias presented to the circuit directly from the $V_{dd}$ supply, without using the scheme of a reference voltage circuit, multiplier, and driver as shown in FIG. 2. For such a case, the loss of $V_{bb}$ condition presented by substrate bias detection circuit 1 may be used simply to gate the external $V_{dd}$ supply to the more sensitive portions of the circuit, so that the external $V_{dd}$ supply is disconnected therefrom if the substrate bias is detected as approaching a dangerous value in the manner described above. Furthermore, portions of the scheme of FIG. 2 may be used in the biasing scheme of the circuit while still utilizing the benefits of the invention. Examples of this would include the elimination of the standby drivers 24, allowing only the main drivers 22 to bias the portions of the circuit where the feature of reduced power is not desired; an additional example would include only a single main driver 22 (possibly together with a single standby driver 24), where only one bias level is necessary in the remainder of the circuit. Such alternatives will also, of course, similarly benefit from the above invention.

Although the invention has been described in detail herein with reference to its preferred embodiment, it is to be understood that this description is by way of example only, and is not to be construed in a limiting sense. It is to be further understood that numerous changes in the details of the embodiments of the invention, and additional embodiments of the invention, will be apparent to, and may be made by, persons of ordinary skill in the art having reference to this description. It is contemplated that such changes and additional embodiments are within the spirit and true scope of the invention as claimed below.

We claim:

1. A memory device, comprising:
   a memory array formed on a semiconductor substrate having a bias node and a substrate node; and
   a regulated power supply system formed on the semiconductor substrate for biasing the bias node and the substrate node, having:
   a reference generator circuit for producing a reference voltage;
   a multiplier circuit connected to the reference generator circuit for increasing the level of the reference voltage;
   a voltage driver circuit connected to the multiplier circuit and the memory array for driving the bias node;
   a substrate bias generator circuit connected to the substrate node for producing a substrate bias voltage; and
   a substrate bias detection circuit connected to the substrate bias node and connected to the voltage driver circuit, for disabling the bias at said bias node responsive to the bias at said substrate node exceeding a predetermined value.

2. The memory device of claim 1, wherein said substrate bias generating circuit comprises a charge pump.

3. The memory device of claim 1, wherein said voltage driver has a first input for receiving an input voltage, has a second input coupled to said substrate bias detection circuit, and has an output connected to said bias node;
   wherein said substrate bias detection circuit presents a first logic level to said second input of said voltage driver responsive to the bias at said substrate node exceeding said predetermined voltage; and
   wherein said voltage driver presents a common potential at its output responsive to receiving said first logic state at its second input.

4. The memory device of claim 1, wherein said substrate bias detection circuit comprises:
   a first transistor having its source coupled to said substrate node, and having its drain and gate coupled to a drive node;
   a first load connected between said driver node and a bias potential;
   a second transistor having its source coupled to a common potential, having its gate coupled to said drive node, and having a drain; and
   a second load connected between the drain of said second transistor and said bias potential;
   wherein said drain of said second transistor is coupled to said biasing circuit.

5. An integrated circuit, comprising:
   a functional circuit having a bias node and a substrate node;
   a biasing circuit for biasing the bias node from a power supply terminal; and
   a substrate bias detection circuit connected to said biasing circuit, for disabling the bias at said bias node responsive to the bias at said substrate node exceeding a predetermined voltage, having:
   a first transistor having its source coupled to said substrate node, and having its drain and gate coupled to a drive node;
   a first load connected between said drive node and a bias potential;
   a second transistor having its source coupled to a common potential, having its gate coupled to said drive node, and having a drain;
   a second load connected between the drain of said second transistor and said bias potential;
   wherein said drain of said second transistor is coupled to said biasing circuit; and
   wherein said first and second transistors have different threshold voltages.

6. The integrated circuit of claim 5, wherein the threshold voltage of said first transistor is higher than the threshold voltage of said second transistor.

7. A substrate bias detection circuit, comprising:
   a first transistor having its source coupled to a substrate potential, and having its drain and gate coupled to a drive node;
   a first load connected between said drive node and a bias potential;
   a second transistor having its source coupled to a common potential, having its gate coupled to said drive node, and having a drain;
   a second load connected between the drain of said second transistor and said bias potential; and
   wherein the said first and second transistors have different threshold voltages.

8. The detection circuit of claim 7, wherein the threshold voltage of said first transistor is higher than the threshold voltage of said second transistor.

9. The detection circuit of claim 7, further comprising:
   a buffer circuit connected to the drain of said second transistor.

10. The detection circuit of claim 9, wherein said buffer circuit comprises an inverter.

11. The detection circuit of claim 7, wherein said first load device comprises a transistor.

12. The detection circuit of claim 7, wherein said second load device comprises a transistor.

13. The detection circuit of claim 7, wherein said first and second transistors are of a first conductivity type; and
   wherein said first load device comprises a transistor of a second conductivity type having its source/drain path connected between said drive node and said bias potential, and having its gate coupled to a potential in such a manner that the source/drain path is conductive responsive to said first transistor being conductive.

14. The detection circuit of claim 7, wherein said first and second transistors are of a first conductivity type; and
   wherein said second load device comprises a transistor of a second conductivity type having its source/drain path connected between said drain of said second transistor and said bias potential, and having its gate coupled to the gate of said second transistor.

15. A substrate bias detection circuit, comprising:
   a first n-channel MOS transistor, having its source connected to a substrate potential, and having its gate and drain connected together;
   a second n-channel MOS transistor, having its source connected to a common potential, and having its gate connected to the drain of said first n-channel MOS transistor;
   first and second load devices, connected between a bias potential and the drain of said first and second n-channel MOS transistors, respectively; and
   wherein the threshold voltage of said first n-channel MOS transistor is different from the threshold voltage of said second n-channel MOS transistor.

16. The detection circuit of claim 15, wherein the threshold voltage of said first n-channel MOS transistor is higher than the threshold voltage of said second n-channel MOS transistor.

17. A substrate bias detection circuit, comprising:
   a first transistor connected between a first node and a substrate bias voltage input, its gate connected to the first node;
   a second transistor connected between an output and a reference potential, its gate connected to the first node;
   a third transistor connected between a power supply and the first node; and
   a fourth transistor connected between the power supply and the output, its gate connected to the first node.

18. The substrate bias detection of claim 17 wherein the gate of the third transistor is connected to the reference potential.

19. An integrated circuit that compares a substrate bias voltage to a reference potential, such as ground, comprising:
   a first transistor that has its source connected to the substrate, and has its gate and drain connected together;
   a load device that is connected to a power supply and is connected to the gate and drain of the first transistor;
   an inverter whose input is connected to the gate and drain of the first transistor and to the load device, and whose pull down transistor is connected to the reference potential against which the substrate bias voltage is to be compared, the pull down transistor becoming conductive and thereby causing the inverter to generate a signal if the substrate bias voltage reaches the approximate level of the reference potential.

20. A memory device having an on chip regulated voltage supply system, comprising:
   an array of memory cells formed on a semiconductor substrate;
   a regulated voltage supply system formed on the semiconductor substrate having a reference generator circuit coupled to the array of memory cells to provide it with a regulated voltage and having a substrate bias generator circuit coupled to the semiconductor substrate to provide it with a substrate bias voltage of negative value as compared against a reference potential; and
   a substrate bias detection circuit formed on the semiconductor substrate connected to the semiconductor substrate and coupled to the regulated voltage supply system to measure the substrate bias voltage against the reference potential and to prevent the regulated voltage supply system from providing the array of memory cells with the regulated voltage as the value of the substrate bias voltage nears the value of the reference potential.

21. The memory device of claim 20 wherein the substrate bias detection circuit comprises:
   a transistor having one terminal connected to the semiconductor substrate, and having its other terminal and gate connected together;
   a load device connected to a bias voltage and connected to the gate of the transistor;
   an inverter having its input connected to the gate of the transistor, and having its pull down transistor connected to the reference potential against which the substrate bias voltage is measured, the pull down transistor becoming conductive and thereby causing the inverter to generate a signal that disables the regulated voltage supply system as the value of the substrate bias voltage nears the value of the reference potential.

* * * * *